US012268053B2

(12) United States Patent
Seo et al.

(10) Patent No.: US 12,268,053 B2
(45) Date of Patent: Apr. 1, 2025

(54) METHOD OF MANUFACTURING DISPLAY DEVICE

(71) Applicant: Samsung Display Co., Ltd., Yongin-si (KR)

(72) Inventors: Jong-Oh Seo, Seoul (KR); Ji-Hwan Kim, Hwaseong-si (KR); Byung-Soo So, Yongin-si (KR); Dong-Min Lee, Yongin-si (KR); Jong-Hoon Choi, Hwaseong-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 451 days.

(21) Appl. No.: 17/608,972

(22) PCT Filed: Mar. 30, 2020

(86) PCT No.: PCT/KR2020/004330
§ 371 (c)(1),
(2) Date: Dec. 18, 2021

(87) PCT Pub. No.: WO2020/246694
PCT Pub. Date: Dec. 10, 2020

(65) Prior Publication Data
US 2022/0216285 A1    Jul. 7, 2022

(30) Foreign Application Priority Data
Jun. 7, 2019    (KR) .................. 10-2019-0067577

(51) Int. Cl.
*H01L 21/00* (2006.01)
*H10K 59/121* (2023.01)
(Continued)

(52) U.S. Cl.
CPC ......... *H10K 59/1213* (2023.02); *H10K 71/00* (2023.02); *H10D 30/0314* (2025.01);
(Continued)

(58) Field of Classification Search
CPC .............. H10K 59/1213; H10K 71/00; H10K 59/1201; H01L 27/1222; H01L 27/1274;
(Continued)

(56) References Cited

U.S. PATENT DOCUMENTS 7,989,275 B2    8/2011    Miyairi et al.
8,546,201 B2    10/2013    Chung et al.
(Continued)

FOREIGN PATENT DOCUMENTS

CN    105428243    3/2016
CN    107424957    12/2017
(Continued)

OTHER PUBLICATIONS

Translation of KR 20080048684, 2024.*
(Continued)

*Primary Examiner* — Richard A Booth
(74) *Attorney, Agent, or Firm* — KILE PARK REED & HOUTTEMAN PLLC

(57) ABSTRACT

A method of manufacturing a display device including forming a polysilicon layer on a substrate, patterning the polysilicon layer to form a polysilicon pattern including a first region and a second region each having a first thickness, and a third region having a second thickness less than the first thickness, forming a gate insulation layer on the polysilicon pattern, forming a gate electrode on the gate insulation layer, partially implanting ions into the polysilicon pattern to form an active layer, forming an insulation interlayer on the gate electrode, forming source and drain contact holes each passing through the insulation interlayer and the gate insulation layer and respectively overlapping the first region and the second region, forming source and drain electrodes respectively filling the source and drain contact
(Continued)

holes, and forming a light emitting element electrically connected to the source electrode or the drain electrode.

19 Claims, 11 Drawing Sheets

(51) Int. Cl.
    *H10K 71/00*     (2023.01)
    *H10D 30/01*     (2025.01)
    *H10D 30/67*     (2025.01)
    *H10D 86/01*     (2025.01)
    *H10D 86/40*     (2025.01)
    *H10D 86/60*     (2025.01)
    *H10K 59/12*     (2023.01)

(52) U.S. Cl.
    CPC ..... *H10D 30/0321* (2025.01); *H10D 30/6731* (2025.01); *H10D 30/6745* (2025.01); *H10D 86/0223* (2025.01); *H10D 86/0231* (2025.01); *H10D 86/421* (2025.01); *H10D 86/60* (2025.01); *H10K 59/1201* (2023.02)

(58) Field of Classification Search
    CPC .......... H01L 27/1288; H01L 29/66757; H01L 29/78675
    See application file for complete search history.

(56) References Cited

U.S. PATENT DOCUMENTS

| | | | |
|---|---|---|---|
| 10,249,652 B2 | 4/2019 | Li | |
| 10,355,022 B2 | 7/2019 | Min et al. | |
| 10,411,133 B2 | 9/2019 | Seo et al. | |
| 2004/0238000 A1* | 12/2004 | Yeo | H01L 21/67051 134/32 |
| 2005/0181566 A1* | 8/2005 | Machida | H01L 29/66757 438/149 |
| 2007/0026549 A1 | 2/2007 | Joo et al. | |
| 2008/0067932 A1* | 3/2008 | Baek | H10K 59/1315 313/509 |
| 2011/0300674 A1* | 12/2011 | Chung | H01L 27/1277 438/584 |
| 2013/0313530 A1 | 11/2013 | Seo et al. | |
| 2015/0179802 A1 | 6/2015 | Kim et al. | |
| 2015/0340446 A1* | 11/2015 | Lee | H01L 29/78618 257/43 |
| 2020/0161389 A1 | 5/2020 | Lee et al. | |

FOREIGN PATENT DOCUMENTS

| | | |
|---|---|---|
| KR | 10-2004-0036955 | 5/2004 |
| KR | 10-2005-0105854 | 11/2005 |
| KR | 10-2005-0113414 | 12/2005 |
| KR | 10-0698691 | 3/2007 |
| KR | 10-0761346 | 9/2007 |
| KR | 10-2008-0004799 | 1/2008 |
| KR | 10-2008-0048684 | 6/2008 |
| KR | 10-2009-0097131 | 9/2009 |
| KR | 10-2011-0132808 | 12/2011 |
| KR | 10-2015-0076485 | 7/2015 |
| KR | 10-2019-0038729 | 4/2019 |
| KR | 10-2020-0058622 | 5/2020 |

OTHER PUBLICATIONS

Korean Office Action with English translation for Korean Patent Application No. 10-2019-0067577, dated Jun. 2, 2024.
International Search Report dated Jul. 15, 2020, issued in International Patent Application No. PCT/KR2020/004330.
Chinese Office Action with English translation for Chinese Patent Application No. 202080035110.5, dated Nov. 18, 2024.

* cited by examiner

METHOD OF MANUFACTURING DISPLAY DEVICE

CROSS REFERENCE TO RELATED APPLICATION

This application is a National Stage Entry of International Application No. PCT/KR2020/004330, filed on Mar. 30, 2020, and claims priority from and the benefit of Korean Patent Application No. 10-2019-0067577, filed on Jun. 7, 2019, each of which is hereby incorporated by reference for all purposes as if fully set forth herein.

BACKGROUND

Field

Embodiments of the invention relate generally to a method of manufacturing a display device. More particularly, embodiments relate to a method of manufacturing a display device for improving characteristics of a thin film transistor.

Discussion of the Background

An active matrix (AM) type display device may include a pixel circuit in each pixel, and the pixel circuit may include a thin film transistor (TFT) using silicon. The TFT may be formed of amorphous silicon or polysilicon.

Since an active layer having a source, a drain, and a channel is formed of amorphous silicon (a-Si), an a-Si TFT used in the pixel circuit may have a low electron mobility of about 1 $cm^2$/Vs or less. Therefore, the a-Si TFT has been recently replaced with a polysilicon (poly-Si) TFT. The poly-Si TFT has a higher electron mobility and a safer light illumination than the a-Si TFT. Therefore, the poly-Si TFT may be appropriate to be used as an active layer of a driving TFT and/or a switching TFT of the AM type display device.

The poly-Si may be manufactured according to several methods. These methods may be generally classified as either a method of depositing poly-Si or a method of depositing and crystallizing a-Si.

Examples of the method of depositing the poly-Si include chemical vapor deposition (CVD), sputtering, vacuum evaporation, etc.

Examples of the method of depositing and crystallizing the a-Si include solid phase crystallization (SPC), excimer laser crystallization (ELC), metal induced crystallization (MIC), metal induced lateral crystallization (MILC), sequential lateral solidification (SLS), etc.

The above information disclosed in this Background section is only for understanding of the background of the inventive concepts, and, therefore, it may contain information that does not constitute prior art.

SUMMARY

Embodiments of the present invention provide a method of manufacturing a display device for improving characteristics of a thin film transistor.

Additional features of the inventive concepts will be set forth in the description which follows, and in part will be apparent from the description, or may be learned by practice of the inventive concepts.

An embodiment of the invention provides a method of manufacturing a display device including forming a polysilicon layer on a substrate, patterning the polysilicon layer to form a polysilicon pattern including a first region and a second region each having a first thickness, and a third region having a second thickness less than the first thickness, forming a gate insulation layer on the polysilicon pattern, forming a gate electrode on the gate insulation layer, partially implanting ions into the polysilicon pattern to form an active layer, forming an insulation interlayer on the gate electrode, forming a source contact hole and a drain contact hole each passing through the insulation interlayer and the gate insulation layer and respectively overlapping the first region and the second region, forming a source electrode and a drain electrode respectively filling the source contact hole and the drain contact hole, and forming a light emitting element electrically connected to the source electrode or the drain electrode Forming the polysilicon layer may include forming an amorphous silicon layer on the substrate, cleaning the amorphous silicon layer with hydrofluoric acid, rinsing the amorphous silicon layer with hydrogenated deionized water, and irradiating the amorphous silicon layer with a laser beam.

An energy density of the laser beam may be in a range of about 450 $mJ/cm^2$ to about 500 $mJ/cm^2$.

The first thickness may be greater than about 250 angstroms (Å) and less than about 470 Å.

The second thickness may be in a range of about 250 Å to about 450 Å.

Patterning the polysilicon layer may include forming a photoresist layer on the polysilicon layer, patterning the photoresist layer to form a first photoresist pattern overlapping the first region, the second region, and the third region, etching the polysilicon layer by the first thickness using the first photoresist pattern, patterning the first photoresist pattern to form a second photoresist pattern overlapping the first region and the second region, and etching the polysilicon layer by a thickness obtained by subtracting the second thickness from the first thickness using the second photoresist pattern.

The first photoresist pattern may be formed by exposing and developing the photoresist layer with a first mask. The second photoresist pattern may be formed by exposing and developing the first photoresist pattern with a second mask.

The first photoresist pattern may be formed by exposing and developing the photoresist layer with a halftone mask. The second photoresist pattern may be formed by ashing the first photoresist pattern.

The active layer may include a source region including the first region and implanted with the ions, a drain region including the second region and implanted with the ions, and a channel region formed between the source region and the drain region and not implanted with the ions.

The channel region may overlap the gate electrode.

Forming the source contact hole and the drain contact hole may include etching the first region and the second region of the polysilicon pattern by a thickness greater than or equal to a thickness obtained by subtracting the second thickness from the first thickness.

Forming the light emitting element may include forming a first electrode electrically connected to the source electrode or the drain electrode, forming an emission layer on the first electrode, and forming a second electrode on the emission layer.

Another embodiment of the invention provides a method of manufacturing a display device including forming a polysilicon layer on a substrate, patterning the polysilicon layer to form a polysilicon pattern including a main body, and a first protrusion and a second protrusion each protruding upward from an upper surface of the main body, forming a gate insulation layer on the polysilicon pattern, forming a gate electrode on the gate insulation layer, partially implanting ions into the polysilicon pattern to form an active layer, forming an insulation interlayer on the gate electrode, forming a source contact hole and a drain contact hole each passing through the insulation interlayer and the gate insulation layer and respectively overlapping the first protrusion and the second protrusion, forming a source electrode and a drain electrode respectively filling the source contact hole and the drain contact hole, and forming a light emitting element electrically connected to the source electrode or the drain electrode.

Forming the polysilicon layer may include forming an amorphous silicon layer on the substrate, cleaning the amorphous silicon layer with hydrofluoric acid, rinsing the amorphous silicon layer with hydrogenated deionized water, and irradiating the amorphous silicon layer with a laser beam.

A thickness of the main body may be in a range of about 250 Å to about 450 Å.

Each of a thickness of the first protrusion and a thickness of the second protrusion may be greater than 0 Å and less than about 220 Å.

The active layer may include a source region including the first protrusion and implanted with the ions, a drain region including the second protrusion and implanted with the ions, and a channel region formed between the source region and the drain region and not implanted with the ions.

The channel region may overlap the gate electrode.

Forming the source contact hole and the drain contact hole may include removing the first protrusion and the second protrusion of the polysilicon pattern.

Forming the source contact hole and the drain contact hole may further include forming a first recess overlapping the source contact hole and a second recess overlapping the drain contact hole in the active layer.

In the method of manufacturing the display device according to the inventive concepts, the active layer in which the regions respectively overlapping the source contact hole and the drain contact hole are relatively thick may be formed, or the active layer including the protrusions respectively overlapping the source contact hole and the drain contact hole may be formed, so that the active layer may not be damaged in the process of forming the source contact hole and the drain contact hole. Accordingly, characteristics of the thin film transistor of the display device may be improved.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate exemplary embodiments of the invention, and together with the description serve to explain the inventive concepts.

DETAILED DESCRIPTION

Figure 1:
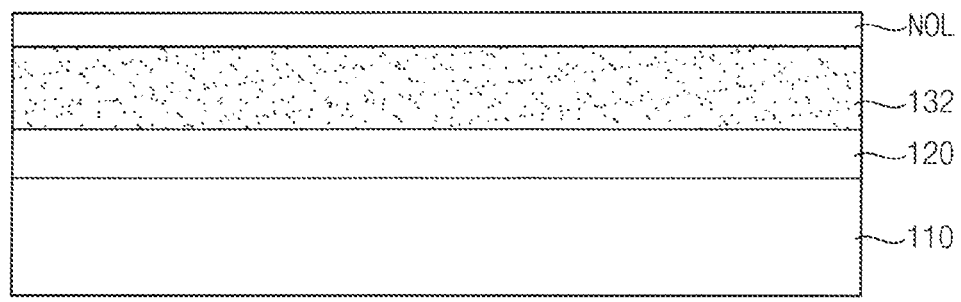
FIGS. 1, 2, 3, 4, 5, 6, 7, 8, 9, 10, 11, 12, 13, and 14 are diagrams illustrating a method of manufacturing a display device according to an embodiment.

In the following description, for the purposes of explanation, numerous specific details are set forth in order to provide a thorough understanding of various exemplary embodiments or implementations of the invention. As used herein "embodiments" and "implementations" are interchangeable words that are non-limiting examples of devices or methods employing one or more of the inventive concepts disclosed herein. It is apparent, however, that various exemplary embodiments may be practiced without these specific details or with one or more equivalent arrangements. Further, various exemplary embodiments may be different, but do not have to be exclusive. For example, specific shapes, configurations, and characteristics of an exemplary embodiment may be used or implemented in another exemplary embodiment without departing from the inventive concepts.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. When an exemplary embodiment may be implemented differently, a specific process order may be performed differently from the described order. For example, two consecutively described processes may be performed substantially at the same time or performed in an order opposite to the described order. Also, like reference numerals denote like elements.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements. Although the terms "first," "second," etc. may be used herein to describe various types of elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

FIGS. 1, 2, 3, 4, 5, 6, 7, 8, 9, 10, 11, 12, 13, and 14 are diagrams illustrating a method of manufacturing a display device according to an embodiment.

Referring to FIGS. 1 to 6, a polysilicon layer 134 may be formed on a substrate 110.

First, as illustrated in FIG. 1, an amorphous silicon layer 132 may be formed on the substrate 110.

The substrate 110 may be an insulating substrate including glass, quartz, ceramic, or the like. In an embodiment, the substrate 110 may be a flexible insulating substrate including plastic, such as polyethylene terephthalate (PET), polyethylene naphthalate (PEN), polyether ether ketone (PEEK), polycarbonate (PC), polyarylate, polyether sulfone (PES), polyimide (PI), or the like.

A buffer layer 120 may be formed on the substrate 110. The buffer layer 120 may provide a flat surface on the substrate 110, and may prevent impurities from penetrating through the substrate 110. For example, the buffer layer 120 may be formed of silicon oxide, silicon nitride, or the like.

The amorphous silicon layer 132 may be formed on the buffer layer 120. The amorphous silicon layer 132 may be formed by a method such as low pressure chemical vapor deposition (LPCVD), atmospheric pressure chemical vapor deposition (APCVD), plasma enhanced chemical vapor deposition (PECVD), sputtering, evaporation, or the like.

In an embodiment, a thickness of the amorphous silicon layer 132 may be greater than about 250 angstroms (Å) and less than about 470 Å. When the thickness of the amorphous silicon layer 132 is less than about 250 Å, a hysteresis characteristic of a thin film transistor, including a polysilicon layer formed by crystallization of the amorphous silicon layer 132, may be deteriorated. When the thickness of the amorphous silicon layer 132 is greater than about 470 Å, an energy density of a laser beam required to crystallize the amorphous silicon layer 132 may excessively increase.

A natural oxide layer NOL may be formed on the amorphous silicon layer 132. The natural oxide layer NOL may be formed when an upper portion of the amorphous silicon layer 132 is exposed to air. When the natural oxide layer NOL remains on the amorphous silicon layer 132, projections each having a relatively large thickness may be formed on a surface of the polysilicon layer by the natural oxide layer NOL in the process of crystallizing the amorphous silicon layer 132 for forming the polysilicon layer.

Figure 2:
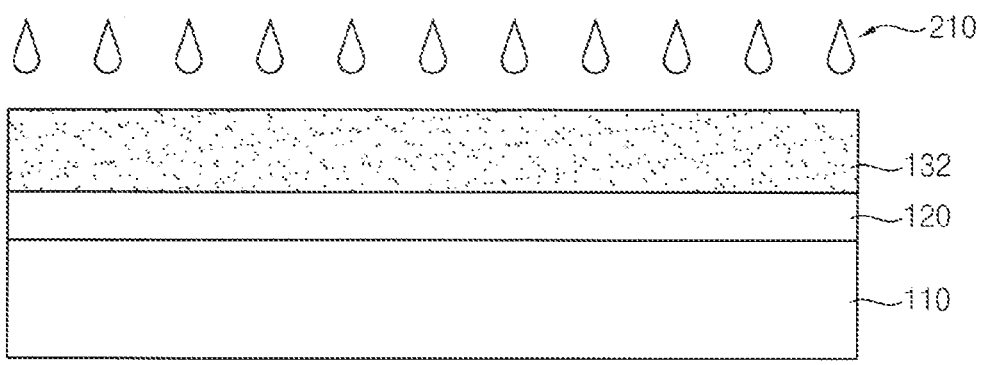

Then, as illustrated in FIG. 2, the amorphous silicon layer 132 may be cleaned.

The amorphous silicon layer 132 may be cleaned using hydrofluoric acid 210. The hydrofluoric acid 210 may be an aqueous solution in which hydrogen fluoride (HF) is dissolved. For example, the hydrofluoric acid 210 may contain about 0.5% hydrogen fluoride. The natural oxide layer NOL formed on the amorphous silicon layer 132 may be removed by cleaning the amorphous silicon layer 132 with the hydrofluoric acid 210.

In an embodiment, the amorphous silicon layer 132 may be cleaned by the hydrofluoric acid 210 for about 60 seconds to about 120 seconds. When the amorphous silicon layer 132 is cleaned for less than about 60 seconds, the natural oxide layer NOL formed on the amorphous silicon layer 132 may not be sufficiently removed, and grains of the polysilicon layer formed thereafter may not sufficiently grow. Further, when the amorphous silicon layer 132 is cleaned for greater than about 120 seconds, the amorphous silicon layer 132 may be affected by the hydrofluoric acid 210 and grains of the polysilicon layer formed thereafter may burst.

Figure 3:
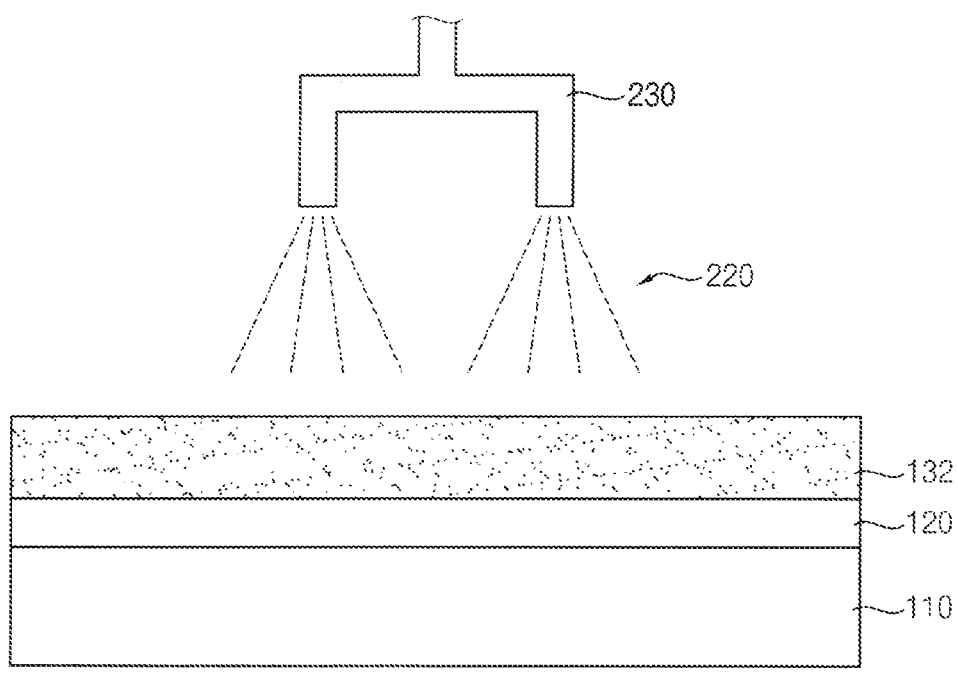

Then, as illustrated in FIG. 3, the amorphous silicon layer 132 may be rinsed.

The amorphous silicon layer 132 may be rinsed using hydrogenated deionized water 220. For example, the hydrogenated deionized water 220 may have a hydrogen concentration of about 1.0 ppm. For example, the hydrogenated deionized water 220 may be supplied to the amorphous silicon layer 132 through a spray 230 while moving the substrate 110 under the fixed spray 230. The hydrofluoric acid 210 remaining on the amorphous silicon layer 132 may be removed by rinsing the amorphous silicon layer 132 with the hydrogenated deionized water 220.

When rinsing the amorphous silicon layer 132 using dehydrogenated deionized water, oxygen in the dehydrogenated deionized water may remain on the amorphous silicon layer 132, and the oxygen may be recognized as a circular defect caused by the oxygen after the crystallization. However, in the present embodiment, by rinsing the amorphous silicon layer 132 using the hydrogenated deionized water 220, the recognition of the circular defect may be prevented.

Figure 4:
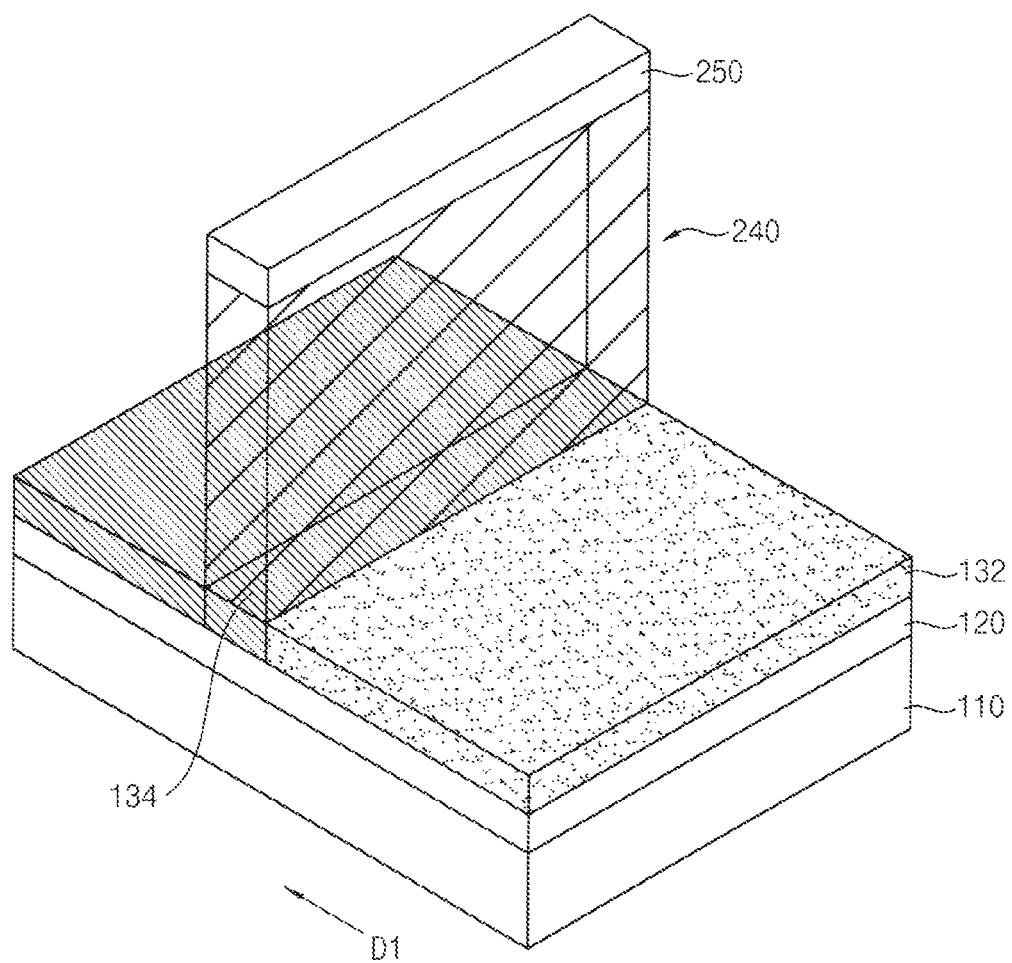
Figure 5:
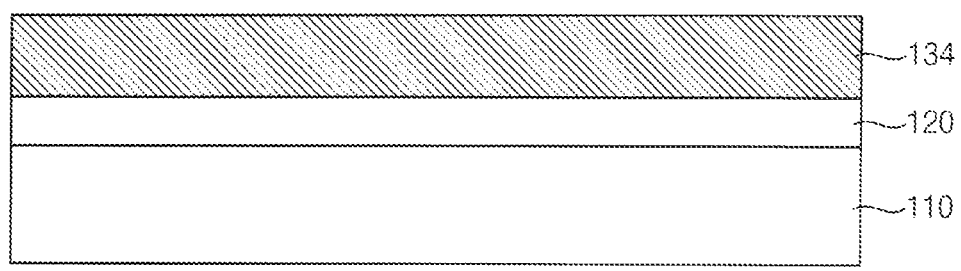

Then, as illustrated in FIGS. 4 and 5, the polysilicon layer 134 may be formed.

The polysilicon layer 134 may be formed by irradiating the amorphous silicon layer 132 with a laser beam 240. A laser 250 may intermittently generate the laser beam 240 to irradiate the amorphous silicon layer 132. For example, the laser 250 may be an excimer laser that generates the laser beam 240 of short wavelength, high power, and high efficiency. For example, the excimer laser may include an inert gas, an inert gas halide, a mercury halide, an inert gas acid compound, a polyatomic excimer, or the like. For example, the inert gas may be $Ar_2$, $Kr_2$, $Xe_2$, etc., the inert gas halide may be ArF, ArCl, KrF, KrCl, XeF, XeCl, etc., the mercury halide may be HgCl, HgBr, HgI, etc., the inert gas acid compound may be ArO, KrO, XeO, etc., and the polyatomic excimer may be $Kr_2F$, $Xe_2F$, etc.

The amorphous silicon layer 132 may be crystallized into the polysilicon layer 134 by irradiating the amorphous silicon layer 132 with the laser beam 240 from the laser 250 while moving the substrate 110 along a first direction D1. The laser 250 may irradiate the amorphous silicon layer 132 with the laser beam 240 having an energy density of about 450 $mJ/cm^2$ to about 500 $mJ/cm^2$. When the energy density of the laser beam 240 is less than about 450 $mJ/cm^2$, a grain size of the polysilicon layer 134 may be relatively small. When the energy density of the laser beam 240 is greater than about 500 $mJ/cm^2$, the amorphous silicon layer 132 may be completely liquefied by the laser beam 240, so that a crystal seed for crystallization of silicon may not be formed. As illustrated in FIG. 4, the amorphous silicon layer 132 may be converted into the polysilicon layer 134 in a region in which the crystallization is performed using the laser beam 240.

Figure 6:
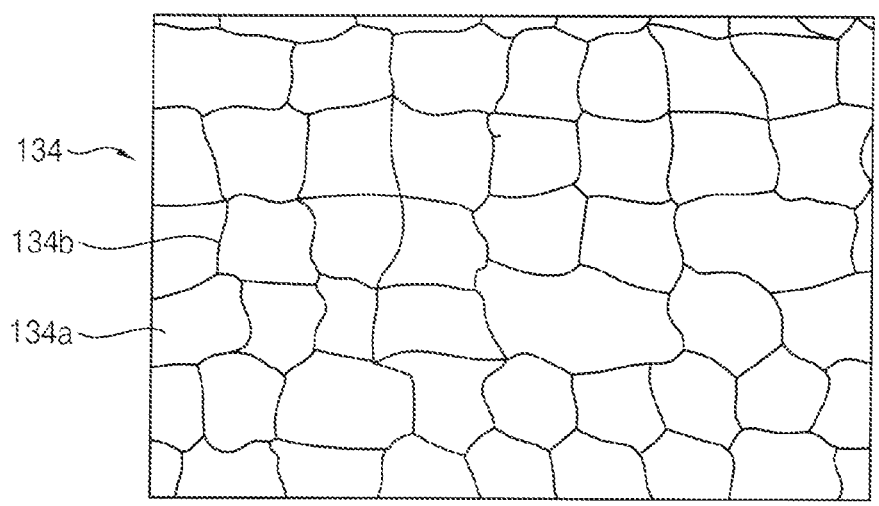

FIG. 6 is a plan view illustrating the polysilicon layer 134.

As illustrated in FIG. 6, a plurality of grains 134a may be formed in the polysilicon layer 134. When the solid amorphous silicon layer 132 is irradiated with the laser beam 240, the amorphous silicon layer 132 may absorb heat to change to a liquid state, and then may release heat to change to a solid state again. In this case, the grain 134a may be formed by growing a crystal from the crystal seed. When there is a difference in the cooling rate in the process of the amorphous silicon layer 132 changing from the liquid state to the solid state, the grain 134a may grow from a region having a fast cooling rate toward a region having a slow cooling rate, so that a grain boundary 134b may be formed in the region having the slow cooling rate.

A projection may be formed at the grain boundary 134b on a surface of the polysilicon layer 134. As the amorphous silicon layer 132 melted by the laser beam 240 is recrystallized around the grain 134a, the projection may be formed at the grain boundary 134b. The projection may protrude upward from the surface of the polysilicon layer 134, and may have a sharp end shape.

A root-mean-square (RMS) value of a surface roughness of the polysilicon layer 134 may be about 4 nm or less. In this case, an RMS value of thicknesses of the projections formed on the surface of the polysilicon layer 134 may be about 4 nm or less.

According to the present embodiment, the polysilicon layer 134 having a relatively small surface roughness may be formed by performing the cleaning process using the hydrofluoric acid 210 and the rinsing process using the hydrogenated deionized water 220 before the crystallization process.

Hereinbefore, the cleaning process, the rinsing process, and the crystallization process for forming the polysilicon layer 134 are described, however, processes for forming the polysilicon layer 134 other than the above-described process may be added, or some of the above-described processes may be omitted. Further, the above-described processes may be performed multiple times. For example, the crystallization process may be performed twice or more.

Referring to FIGS. 7 to 11, a polysilicon pattern 138 may be formed by patterning the polysilicon layer 134. The polysilicon pattern 138 may include a first region R1 and a second region R2 each having a first thickness TH1, and a third region R3 having a second thickness TH2 less than the first thickness TH1. The first region R1 and the second region R2 may respectively overlap a source contact hole and a drain contact hole formed in a subsequent process.

Figure 7:
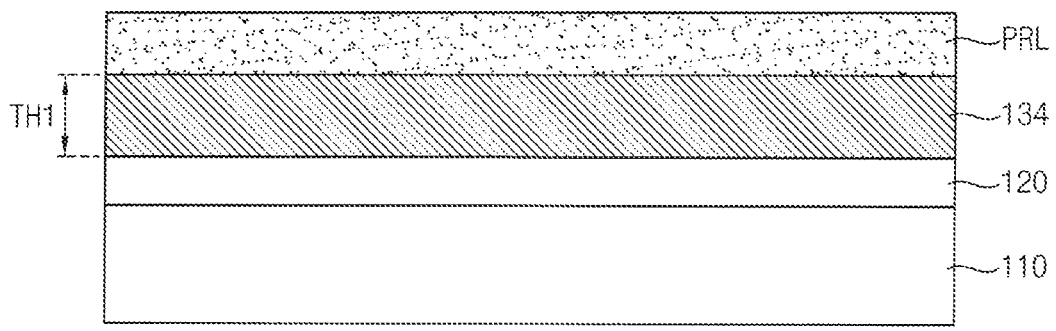

First, as illustrated in FIG. 7, a photoresist layer PRL may be formed on the polysilicon layer 134 having the first thickness TH1. The photoresist layer PRL may be formed of a photosensitive organic material. In an embodiment, the photoresist layer PRL may include a positive photosensitive organic material in which a portion exposed to light is removed. However, the inventive concepts are not limited thereto, and in another embodiment, the photoresist layer PRL may include a negative photosensitive organic material in which a portion exposed to light is cured.

Figure 8:
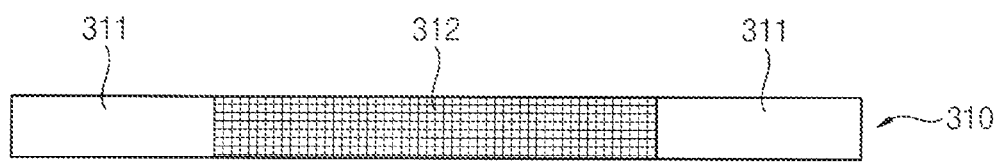
Figure 8:
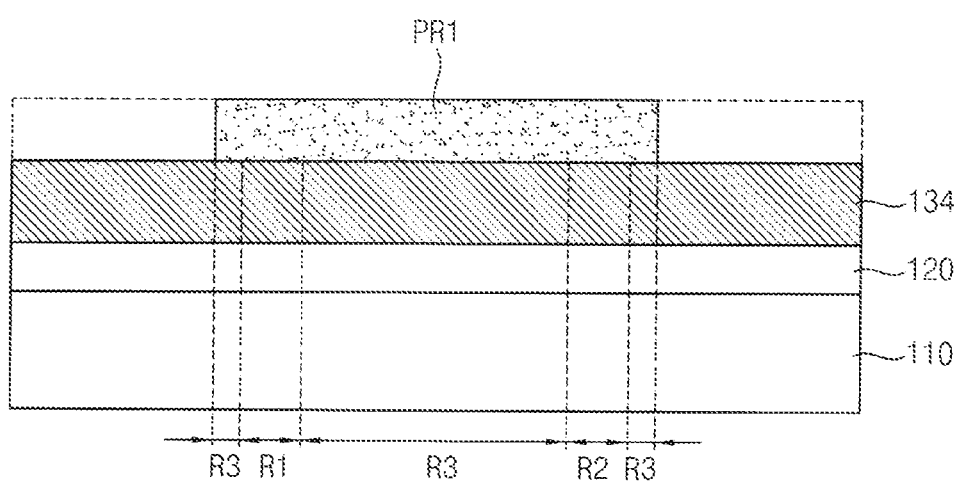

Then, as illustrated in FIG. 8, the photoresist layer PRL may be patterned to form a first photoresist pattern PR1.

A first mask 310 may be disposed on the photoresist layer PRL, and the photoresist layer PRL may be exposed using the first mask 310. The first mask 310 may include a light transmitting portion 311 and a light blocking portion 312. The light transmitting portion 311 may transmit light, and the light blocking portion 312 may block light. The light blocking portion 312 may overlap the first region R1, the second region R2, and the third region R3 of the polysilicon layer 134, and the light transmitting portion 311 may not overlap the first region R1, the second region R2, and the third region R3 of the polysilicon layer 134.

The first photoresist pattern PR1 may be formed by developing the photoresist layer PRL irradiated with light through the first mask 310. A portion of the photoresist layer PRL corresponding to the light transmitting portion 311 may be substantially entirely removed, and a portion of the photoresist layer PRL corresponding to the light blocking portion 312 may remain without being substantially removed.

Figure 9:
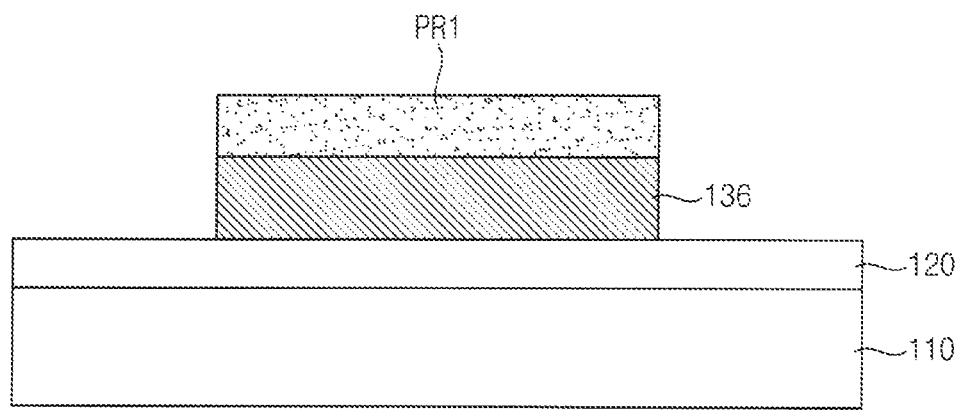

Then, as illustrated in FIG. 9, the polysilicon layer 134 may be etched using the first photoresist pattern PR1.

Regions of the polysilicon layer 134 other than the first to third regions R1, R2, and R3 exposed by the first photoresist pattern PR1 may be etched by the first thickness TH1 by dry etching, wet etching, or the like. As the regions of the polysilicon layer 134 other than the first to third regions R1, R2, and R3 are entirely etched, a preliminary polysilicon pattern 136 may be formed.

Figure 10:
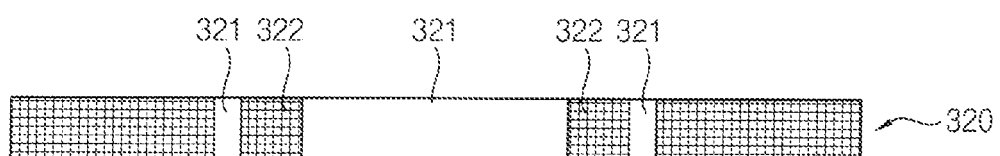
Figure 10:
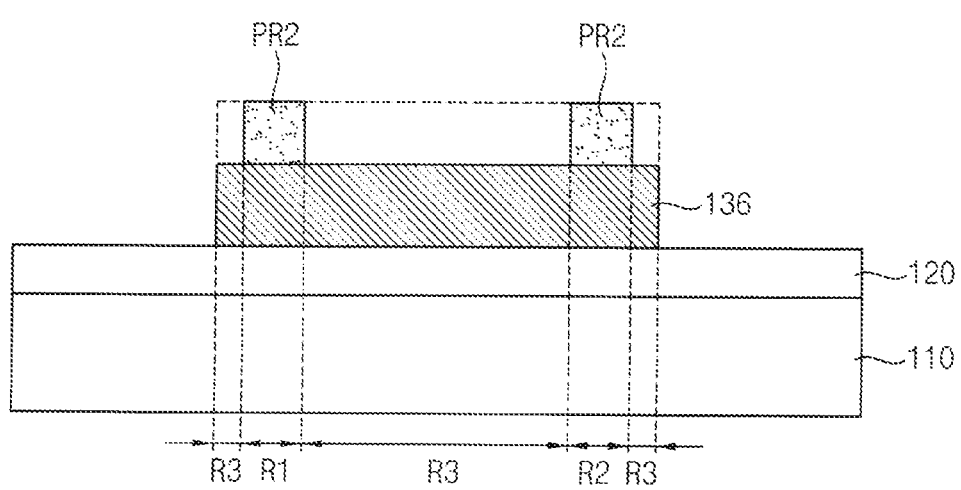

Then, as illustrated in FIG. 10, the first photoresist pattern PR1 may be patterned to form the second photoresist pattern PR2.

A second mask 320 may be disposed on the first photoresist pattern PR1, and the first photoresist pattern PR1 may be exposed using the second mask 320. The second mask 320 may include a light transmitting portion 321 and a light blocking portion 322. The light transmitting portion 321 may transmit light, and the light blocking portion 322 may block light. The light blocking portion 322 may overlap the first region R1 and the second region R2 of the preliminary polysilicon pattern 136, and the light transmitting portion 321 may overlap the third region R3 of the preliminary polysilicon pattern 136.

The second photoresist pattern PR2 may be formed by developing the first photoresist pattern PR1 irradiated with light through the second mask 320. A portion of the first photoresist pattern PR1 corresponding to the light transmitting portion 321 may be substantially entirely removed, and a portion of the first photoresist pattern PR1 corresponding to the light blocking portion 322 may remain without being substantially removed.

Figure 11:
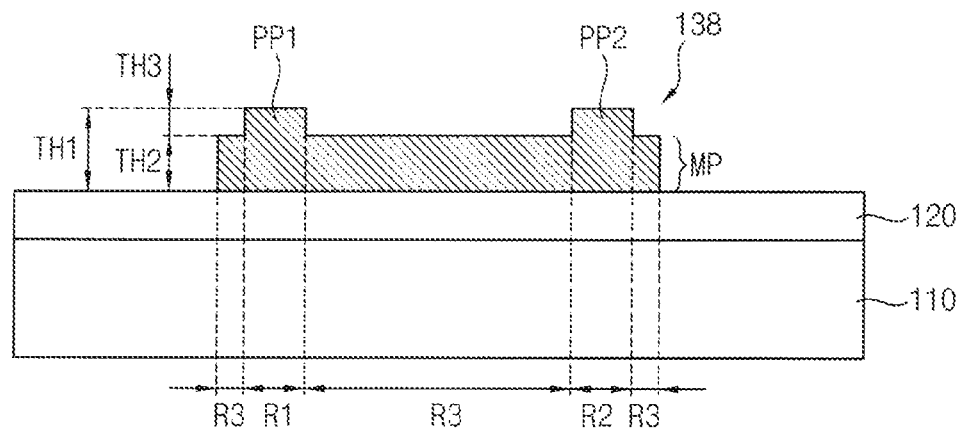

Then, as illustrated in FIG. 11, the preliminary polysilicon pattern 136 may be etched using the second photoresist pattern PR2.

The third region R3 of the preliminary polysilicon pattern 136 exposed by the second photoresist pattern PR2 may be etched by a third thickness TH3 obtained by subtracting the second thickness TH2 from the first thickness TH1 by dry etching, wet etching, or the like. As the third region R3 of the preliminary polysilicon pattern 136 is partially etched, the polysilicon pattern 138 may be formed.

The polysilicon pattern 138 may include a main body MP positioned on the buffer layer 120 and a first protrusion PP1 and a second protrusion PP2 each protruding upward from an upper surface of the main body MP. The main body MP may have the second thickness TH2, and each of the first protrusion PP1 and the second protrusion PP2 may have the third thickness TH3. In this case, the first region R1 may include the first protrusion PP1, and the second region R2 may include the second protrusion PP2.

In an embodiment, the first thickness TH1, which is a thickness of each of the first region R1 and the second region R2 of the polysilicon pattern 138, may be greater than about 250 Å and less than about 470 Å. Further, the second thickness TH2, which is a thickness of the third region R3 of the polysilicon pattern 138, may be about 250 Å to about 450 Å.

Accordingly, a thickness of the main body MP of the polysilicon pattern 138 may be about 250 Å to about 450 Å, and the third thickness TH3, which is a thickness of each of the first protrusion PP1 and the second protrusion PP2 of the polysilicon pattern 138, may be greater than 0 Å and less than about 220 Å. In an embodiment, the thickness of each of the first protrusion PP1 and the second protrusion PP2 may be about 5% to about 15% of the thickness of the main body MP. In other words, the third thickness TH3 may be about 5% to about 15% of the second thickness TH2.

Figure 12:
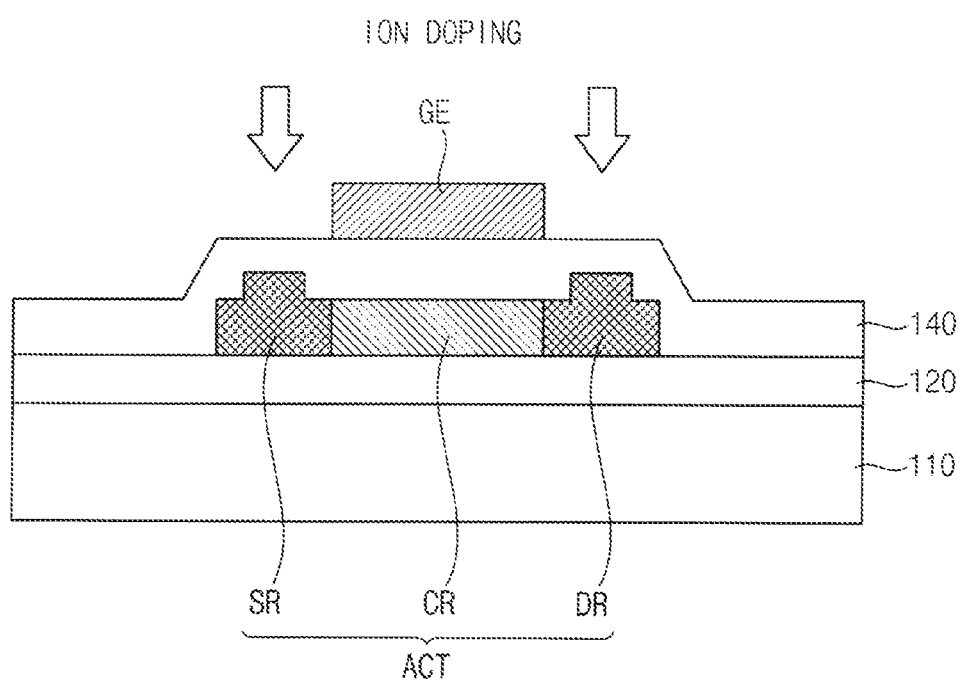

Referring to FIG. 12, a gate insulation layer 140 and a gate electrode GE may be sequentially formed on the polysilicon pattern 138, and ions may be partially implanted into the polysilicon pattern 138 to form an active layer ACT.

First, the gate insulation layer 140 may be formed on the polysilicon pattern 138. The gate insulation layer 140 may be disposed on the buffer layer 120 to cover the polysilicon pattern 138. For example, the gate insulation layer 140 may be formed of silicon oxide, silicon nitride, or the like.

In the present embodiment, the polysilicon pattern 138 having an RMS value of the surface roughness of about 4 nm or less is formed, so that the polysilicon pattern 138 may have a relatively small surface roughness. Accordingly, this may minimize any influence to the gate insulation layer 140 formed on the polysilicon pattern 138 by the projections formed on the surface of the polysilicon pattern 138, and the gate insulation layer 140 may be formed with a relatively thin thickness. For example, the gate insulation layer 140 may have a thickness of about 30 nm to about 200 nm.

Then, the gate electrode GE may be formed on the gate insulation layer 140.

The gate electrode GE may overlap a portion of the polysilicon pattern 138. The gate electrode (GE) may include gold (Au), silver (Ag), aluminum (Al), copper (Cu), nickel (Ni), platinum (Pt), magnesium (Mg), chromium (Cr), tungsten (W), Molybdenum (Mo), titanium (Ti), or an alloy thereof, and may have a single-layer structure or a multilayer structure including different metal layers. For example, the gate electrode GE may include a triple layer of molybdenum-aluminum-molybdenum, a double layer of copper-titanium, or the like.

Then, the active layer ACT may be formed by partially implanting ions into the polysilicon pattern 138.

By partially doping the polysilicon pattern 138 through an ion implantation process, the active layer ACT including a source region SR, a channel region CR, and a drain region DR may be formed. The ions may be n-type impurities or p-type impurities.

The ions may not be implanted in a portion of the polysilicon pattern 138 which overlaps the gate electrode GE, so that the channel region CR may be formed. A portion of the polysilicon pattern 138 to which the ions are implanted may have a conductive property due to an increase in conductivity, so that the source region SR and the drain region DR may be formed. The channel region CR may be formed between the source region SR and the drain region DR. In this case, the source region SR may include the first region R1 including the first protrusion PP1, and the drain region DR may include the second region R2 including the second protrusion PP2.

In an embodiment, by doping impurities at a lower concentration than the ion implantation process, a low-concentration doped region may be formed between the channel region CR and the source region SR, and between the channel region CR and the drain region DR. The low-concentration doped region may act as a buffer in the active layer ACT, thereby improving electrical properties of the thin film transistor.

Figure 13:
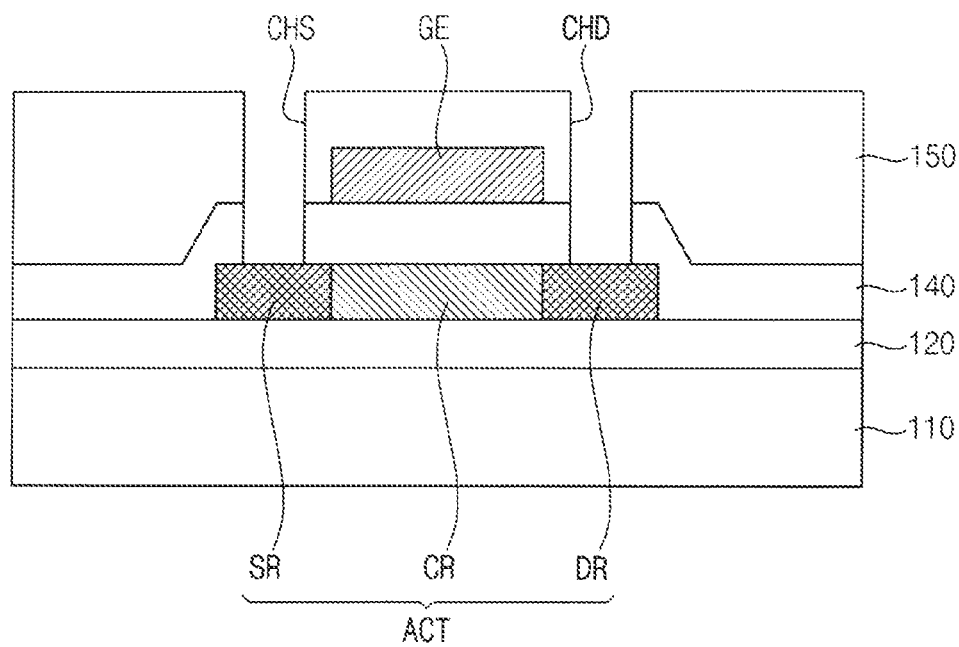

Referring to FIG. 13, an insulation interlayer 150 may be formed on the gate electrode GE, and a source contact hole CHS and a drain contact hole CHD may be formed.

First, the insulation interlayer 150 covering the gate electrode GE may be formed on the gate insulation layer 140. The insulation interlayer 150 may include an inorganic insulation layer, an organic insulation layer, or a combination thereof. For example, the insulation interlayer 150 may include silicon oxide, silicon nitride, silicon carbide, or a combination thereof, or may include an insulating metal oxide, such as aluminum oxide, tantalum oxide, hafnium oxide, zirconium oxide, titanium oxide, or the like. When the insulation interlayer 150 includes an organic insulation layer, the insulation interlayer 150 may include polyimide, polyamide, acrylic resin, phenol resin, benzocyclobutene (BCB), or the like.

Then, the source contact hole CHS and the drain contact hole CHD each passing through the insulation interlayer 150 and the gate insulation layer 140 may be formed. The source contact hole CHS and the drain contact hole CHD may overlap the first region R1 and the second region R2 of the active layer ACT, respectively. In other words, the source contact hole CHS and the drain contact hole CHD may overlap the first protrusion PP1 and the second protrusion PP2, respectively.

In the process of forming the source contact hole CHS and the drain contact hole CHD, the first region R1 and the second region R2 of the active layer ACT may be etched together with the insulation interlayer 150 and the gate insulation layer 140. The first region R1 and the second region R2 of the active layer ACT may be etched by a thickness greater than or equal to the third thickness TH3 and less than the first thickness TH1. Accordingly, the first protrusion PP1 and the second protrusion PP2 of the active layer ACT may be removed.

In an embodiment, the first region R1 and the second region R2 of the active layer ACT may be etched by the third thickness TH3. For example, only the first protrusion PP1 and the second protrusion PP2 of the active layer ACT may be removed, so that the main body MP may substantially remain. In such an embodiment, an upper surface of the active layer ACT may be substantially flat.

Because the first region R1 and the second region R2 of the active layer ACT overlapping the source contact hole CHS and the drain contact hole CHD, respectively, are formed to be relatively thick (or the first protrusion PP1 and the second protrusion PP2 of the active layer ACT protruding upward from the main body MP of the active layer ACT and overlapping the source contact hole CHS and the drain contact hole CHD, respectively, are formed), although the first region R1 and the second region R2 of the active layer ACT are etched in the process of forming the source contact hole CHS and the drain contact hole CHD, holes passing through the active layer ACT may not be formed in the active layer ACT. Accordingly, characteristics of the thin film transistor including the active layer ACT may be improved.

Figure 14:
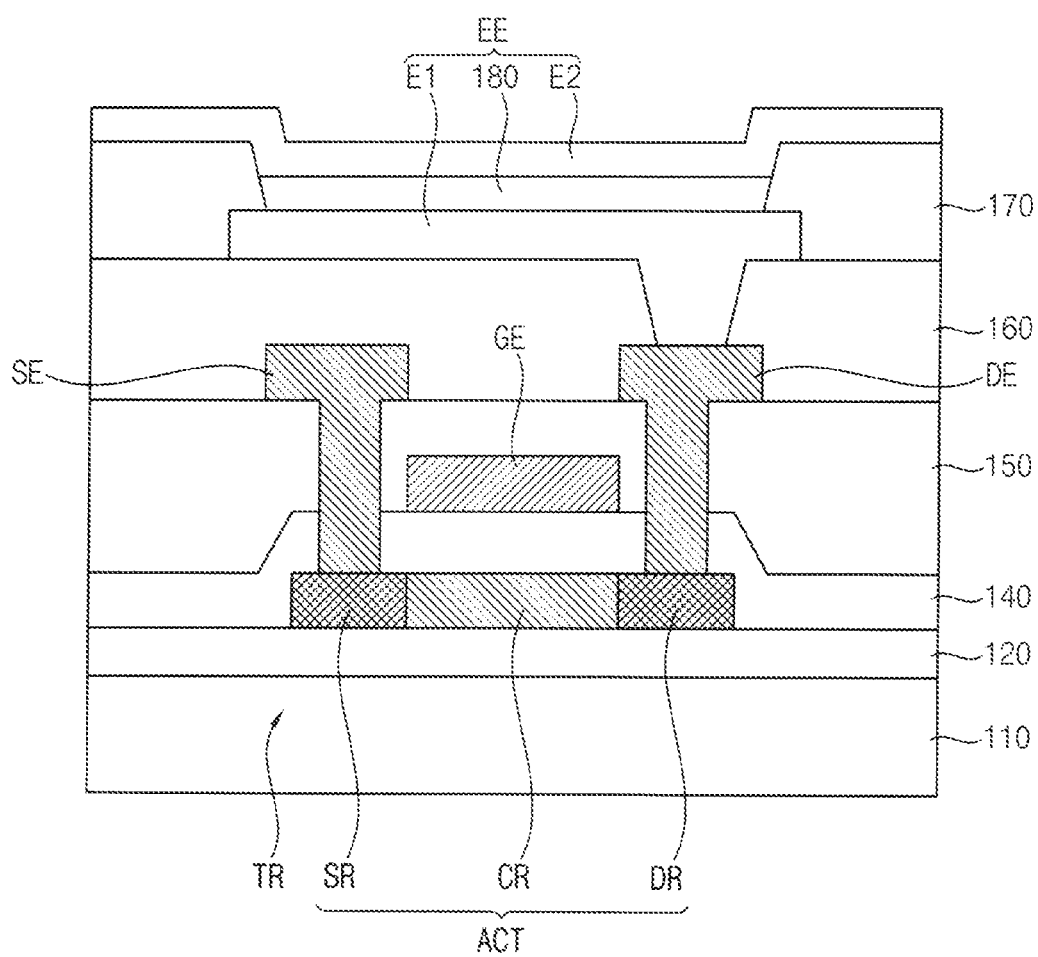

Referring to FIG. 14, a source electrode SE and a drain electrode DE filling the source contact hole CHS and the drain contact hole CHD, respectively, may be formed, and a light emitting element EE electrically connected to the source electrode SE or the drain electrode DE may be formed.

First, the source electrode SE and the drain electrode DE respectively filling the source contact hole CHS and the drain contact hole CHD and respectively connected to the source region SR and the drain region DR of the active layer ACT may be formed. For example, a metal layer may be formed on the insulation interlayer 150 and patterned to form the source electrode SE in contact with the source region SR and the drain electrode DE in contact with the drain region DR.

The source electrode SE and the drain electrode DE may include gold (Au), silver (Ag), aluminum (Al), copper (Cu), nickel (Ni), platinum (Pt), magnesium (Mg), chromium (Cr), tungsten (W), molybdenum (Mo), titanium (Ti), or an alloy thereof, and may have a single-layer structure or a multilayer structure including different metal layers. For example, the source electrode SE and the drain electrode DE may include a triple layer of molybdenum-aluminum-molybdenum, a double layer of copper-titanium, or the like. Accordingly, the thin film transistor TR including the active layer ACT, the gate electrode GE, the source electrode SE, and the drain electrode DE may be formed.

Then, a planarization layer (or protective layer) 160 may be formed on the source electrode SE and the drain electrode DE. The planarization layer 160 may cover the source electrode SE and the drain electrode DE, and may be formed on the insulation interlayer 150. The planarization layer 160 may protect the thin film transistor TR, and may provide a flat surface on the thin film transistor TR.

The planarization layer 160 may include an organic insulation layer, an inorganic insulation layer, or a combination thereof. For example, the planarization layer 160 may have a single-layer structure of silicon nitride or silicon oxide or a multilayer structure. When the planarization layer 160 includes an organic insulation layer, the planarization layer 160 may include polyimide, acrylic resin, phenol resin, benzocyclobutene (BCB), polyamide, or the like.

Then, the planarization layer 160 may be patterned to form a contact hole exposing the source electrode SE or the drain electrode DE. In an embodiment, as illustrated in FIG. 14, the drain electrode DE may be exposed by the contact hole. However, the inventive concepts are not limited thereto, and in another embodiment, the source electrode SE may be exposed.

Then, a first electrode E1 electrically connected to the drain electrode DE may be formed on the planarization layer 160. For example, a metal layer may be formed on the planarization layer 160 and patterned to form the first electrode E1 in contact with the drain electrode DE.

In an embodiment, the first electrode E1 may be an anode of the light emitting element EE. However, the inventive concepts are not limited thereto, and in another embodiment, the first electrode E1 may be a cathode of the light emitting element EE. The first electrode E1 may be formed as a transmissive electrode or a reflective electrode depending on the emission type of the light emitting element EE. When the first electrode E1 is formed as the transmissive electrode, the first electrode E1 may include indium tin oxide (ITO), indium zinc oxide (IZO), zinc tin oxide (ZTO), indium oxide ($In_2O_3$), zinc oxide (ZnO), tin oxide ($SnO_2$), or the like. When the first electrode E1 is formed as the reflective electrode, the first electrode E1 may include gold (Au), silver (Ag), aluminum (Al), copper (Cu), nickel (Ni), platinum (Pt), magnesium (Mg), chromium (Cr), tungsten (W), molybdenum (Mo), titanium (Ti), or the like, and may have a laminated structure with the material used for the transmissive electrode.

Then, a pixel defining layer 170 may be formed on the planarization layer 160. The pixel defining layer 170 may have an opening exposing at least a portion of the first electrode E1. For example, the pixel defining layer 170 may include an organic insulating material.

Then, the emission layer 180 may be formed on the first electrode E1. The emission layer 180 may be formed on an upper surface of the first electrode E1 exposed by the opening of the pixel defining layer 170. For example, the emission layer 180 may be formed by a method such as screen printing, inkjet printing, vapor deposition, or the like.

The emission layer 180 may include at least one of an organic light emitting material and a quantum dot. In an embodiment, the organic light emitting material may include a low molecular weight organic compound or a high molecular weight organic compound. The low molecular weight organic compound may include copper phthalocyanine, N,N-diphenylbenzidine, tris-(8-hydroxyquinoline)aluminum, or the like, and the high molecular organic compound may include poly(3,4-ethylenedioxythiophene), polyaniline, poly-phenylenevinylene, polyfluorene, or the like.

In an embodiment, the quantum dot may include a core including a group II-VI compound, a group DIN compound, a group IV-VI compound, a group IV element, a group IV compound, and a combination thereof. In an embodiment, the quantum dot may have a core-shell structure including the core and a shell surrounding the core. The shell may serve as a protective layer for maintaining semiconductor properties by preventing chemical modification of the core, and as a charging layer for imparting electrophoretic properties to the quantum dot.

In an embodiment, the emission layer 180 may emit red, green, or blue light. In another embodiment, when the emission layer 180 emits white light, the emission layer 180 may have a multilayer structure including a red emission layer, a green emission layer, and a blue emission layer, or a single-layer structure containing a red emission material, a green emission material, and a blue emission material.

In an embodiment, a hole injection layer and/or a hole transport layer may be further formed between the first electrode E1 and the emission layer 180, or an electron transport layer and/or an electron injection layer may be further formed on the emission layer 180.

Then, a second electrode E2 may be formed on the emission layer 180. In an embodiment, the second electrode E2 may be a cathode of the light emitting element EE. However, the present invention is not limited thereto, and in other embodiments, the first electrode E1 may be an anode of the light emitting element EE. The second electrode E2 may be formed as a transmissive electrode or a reflective electrode depending on the emission type of the light emitting element EE. For example, when the second electrode E2 is formed as the transmissive electrode, the second electrode E2 may include lithium (Li), calcium (Ca), lithium fluoride (LiF), aluminum (Al), magnesium (Mg), or a combination thereof. Accordingly, the light emitting element EE including the first electrode E1, the emission layer 180, and the second electrode E2 may be formed.

Hereinafter, a method of manufacturing a display device according to another embodiment will be described with reference to FIGS. 7, 11, and 15 to 17.

Figure 15:
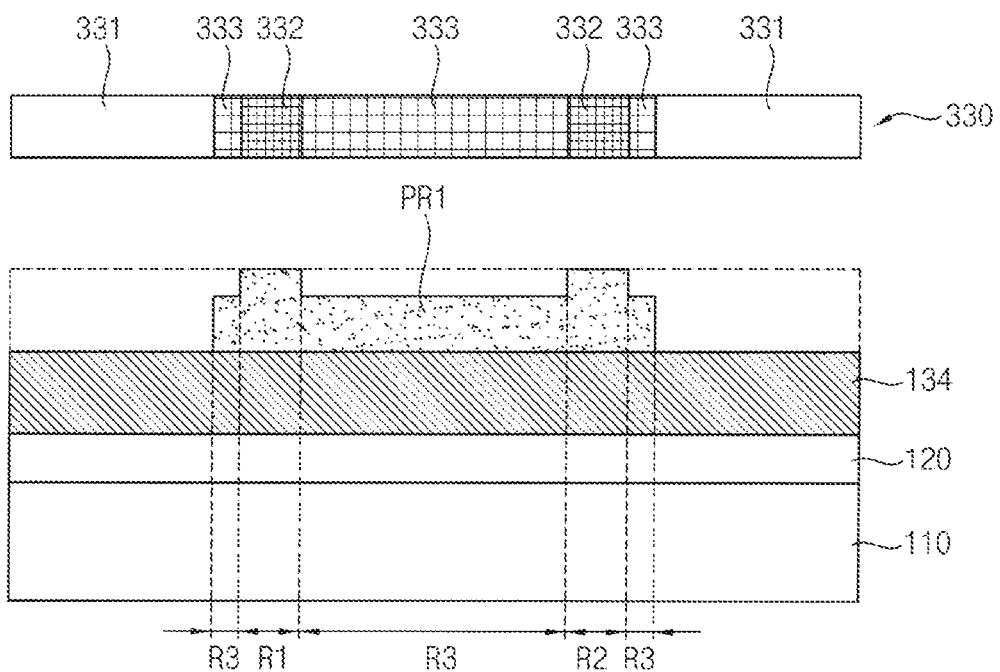
FIGS. 15, 16, and 17 are diagrams illustrating a method of manufacturing a display device according to another embodiment.
Figure 16:
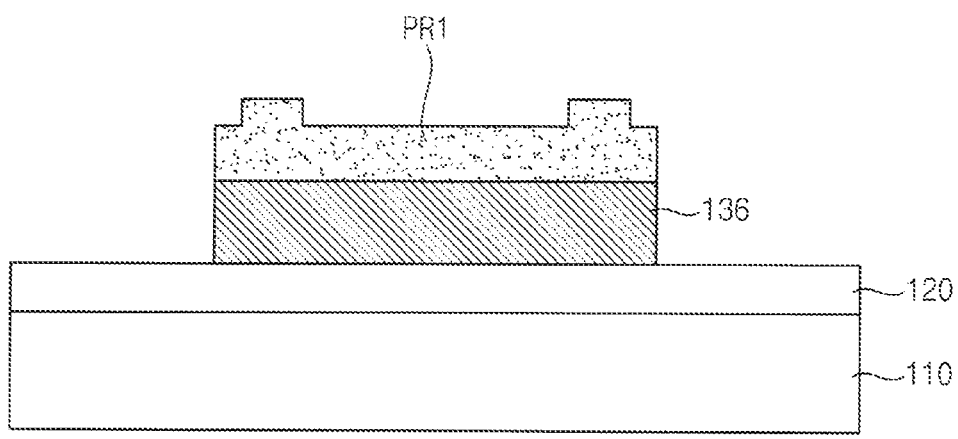
Figure 17:
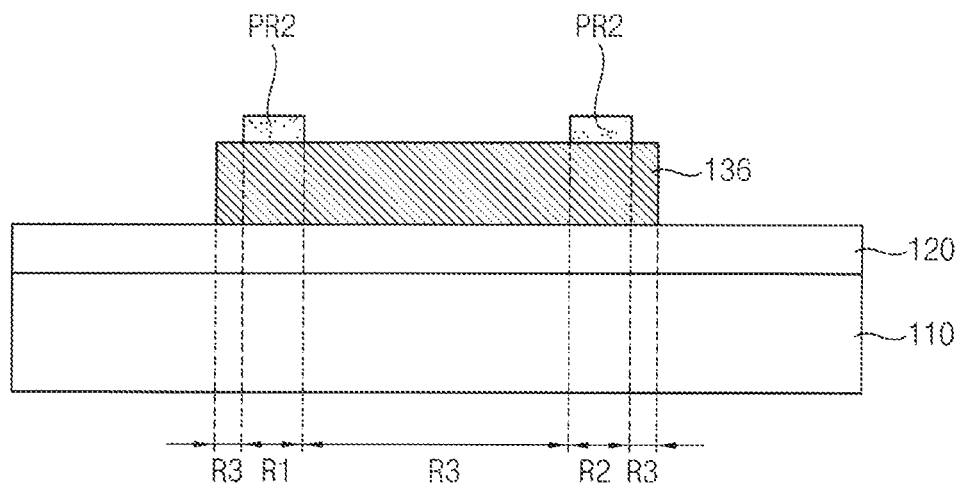

FIGS. 15, 16, and 17 are diagrams illustrating a method of manufacturing a display device according to another embodiment.

Referring to FIGS. 7, 11, and 15 to 17, the polysilicon pattern 138 may be formed by patterning the polysilicon layer 134. Descriptions on components of a method of manufacturing a display device according to another embodiment described with reference to FIGS. 7, 11, and 15 to 17, which are substantially the same as or similar to those of the method of manufacturing the display device according to an embodiment described with reference to FIGS. 1 to 14, will not be repeated.

First, as illustrated in FIG. 7, a photoresist layer PRL may be formed on the polysilicon layer 134 having the first thickness TH1.

Then, as illustrated in FIG. 15, the photoresist layer PRL may be patterned to form a first photoresist pattern PR1.

A halftone mask 330 may be disposed on the photoresist layer PRL, and the photoresist layer PRL may be exposed using the halftone mask 330. The halftone mask 330 may include a light transmitting portion 331, a light blocking portion 332, and a light transflective portion 333. The light transmitting portion 331 may transmit light, the light blocking portion 332 may block light, and the light transflective portion 333 may transmit a part of the light. A light transmittance of the light transflective portion 333 may be less than a light transmittance of the light transmitting portion 331 and greater than a light transmittance of the light blocking portion 332. The light blocking portion 332 may overlap the first region R1 and the second region R2 of the polysilicon layer 134, the light transflective portion 333 may overlap the third region R3 of the polysilicon layer 134, and the light transmitting portion 331 may not overlap the first region R1, the second region R2, and the third region R3 of the polysilicon layer 134.

The first photoresist pattern PR1 may be formed by developing the photoresist layer PRL irradiated with light through the halftone mask 330. A portion of the photoresist layer PRL corresponding to the light transmitting portion 331 may be substantially entirely removed, and a portion of the photoresist layer PRL corresponding to the light blocking portion 332 may remain without being substantially removed. A portion of the photoresist layer PRL corresponding to the light transflective portion 333 may be partially removed. Accordingly, the first photoresist pattern PR1 in which a thickness of the portion corresponding to the light blocking portion 332 is greater than a thickness of the portion corresponding to the light transflective portion 333 may be formed.

Then, as illustrated in FIG. 16, the polysilicon layer 134 may be etched using the first photoresist pattern PR1.

A region other than the first region R1, the second region R2, and the third region R3 of the polysilicon layer 134 exposed by the first photoresist pattern PR1 may be etched by the first thickness TH1. As the region of the polysilicon layer 134 other than the first region R1, the second region R2, and the third region R3 is entirely etched, a preliminary polysilicon pattern 136 may be formed.

Then, as illustrated in FIG. 17, a second photoresist pattern PR2 may be formed by patterning the first photoresist pattern PR1.

The first photoresist pattern PR1 may be ashed to form the second photoresist pattern PR2. The first photoresist pattern PR1 may be ashed using oxygen plasma containing $O_2$ gas. As the first photoresist pattern PR1 is ashed, a relatively thin portion of the first photoresist pattern PR1 may be substantially entirely removed, and a relatively thick portion of the first photoresist pattern PR1 may be partially removed to have a portion still remain. Accordingly, the second photoresist pattern PR2 overlapping the first region R1 and the second region R2 of the preliminary polysilicon pattern 136 may be formed.

Then, as illustrated in FIG. 11, the preliminary polysilicon pattern 136 may be etched using the second photoresist pattern PR2.

The third region R3 of the preliminary polysilicon pattern 136 exposed by the second photoresist pattern PR2 may be etched by the third thickness TH3 obtained by subtracting the second thickness TH2 from the first thickness TH1. As the third region R3 of the preliminary polysilicon pattern 136 is partially etched, the polysilicon pattern 138 may be formed.

Hereinafter, a method of manufacturing a display device according to still another embodiment will be described with reference to FIGS. 18 and 19.

Figure 18:
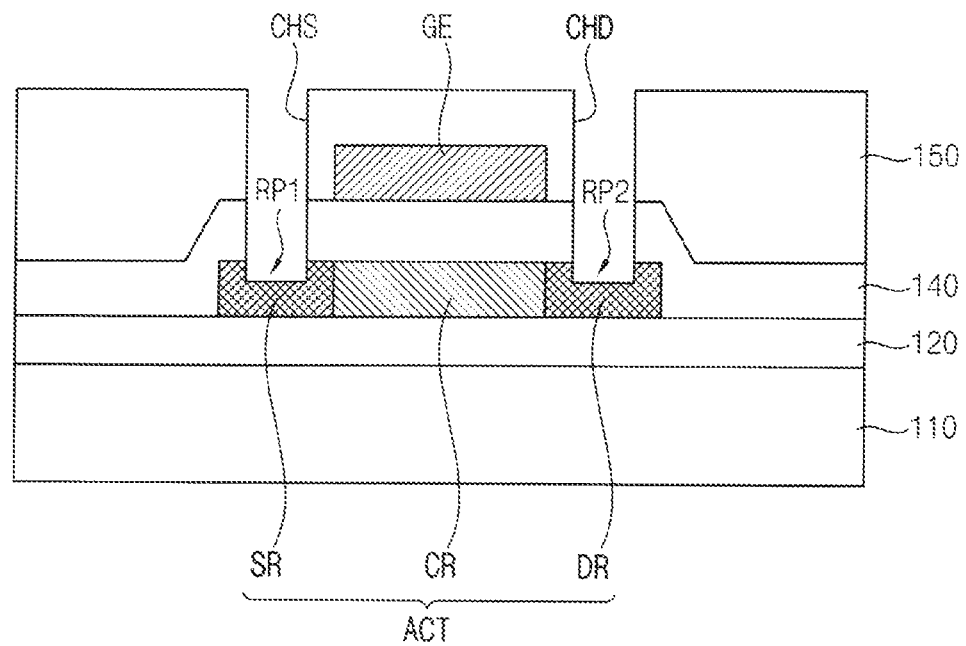
FIGS. 18 and 19 are diagrams illustrating a method of manufacturing a display device according to still another embodiment.
Figure 19:
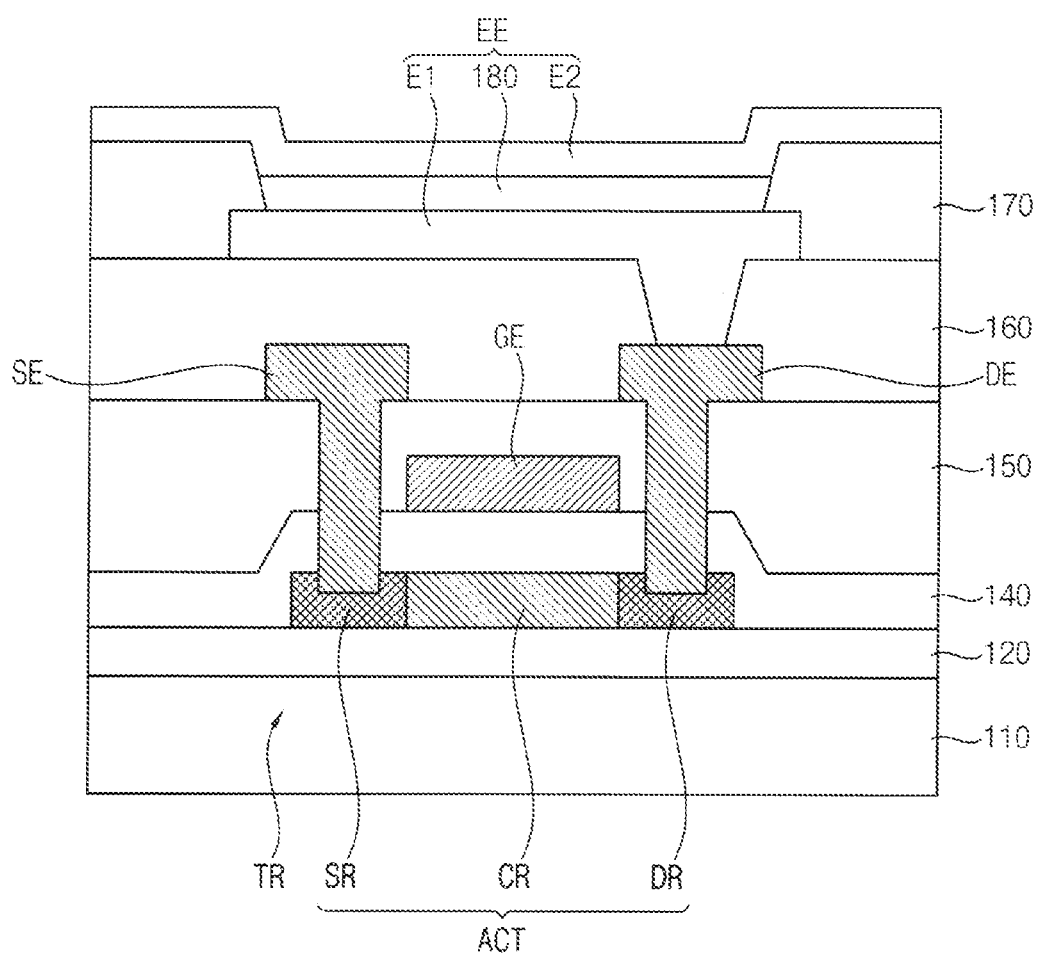

FIGS. 18 and 19 are diagrams illustrating a method of manufacturing a display device according to still another embodiment.

Referring to FIGS. 18 and 19, a source contact hole CHS and a drain contact hole CHD may be formed, a source electrode SE and a drain electrode filling the source contact hole CHS and the drain contact hole CHD, respectively, may be formed, and a light emitting element EE electrically connected to the source electrode SE or the drain electrode DE may be formed. Descriptions on components of a method of manufacturing a display device according to still another embodiment described with reference to FIGS. 18 and 19, which are substantially the same as or similar to those of the method of manufacturing the display device according to an embodiment described with reference to FIGS. 1 to 14, will not be repeated.

First, as illustrated in FIG. 18, the source contact hole CHS and the drain contact hole CHD penetrating the insulation interlayer 150 and the gate insulation layer 140 may be formed. In the process of forming the source contact hole CHS and the drain contact hole CHD, the first region R1 and the second region R2 of the active layer ACT may be etched together with the insulation interlayer 150 and the gate insulation layer 140.

In an embodiment, the first region R1 and the second region R2 of the active layer ACT may be etched by a thickness substantially greater than the third thickness TH3 and less than the first thickness TH1. For example, portions of the main body MP respectively overlapping the first protrusion PP1 and the second protrusion PP2 of the active layer ACT may be partially etched together with the first protrusion PP1 and the second protrusion PP2. In such an embodiment, a first recess RP1 and a second recess RP2 respectively overlapping the source contact hole CHS and the drain contact hole CHD may be formed on an upper surface of the active layer ACT.

Then, as illustrated in FIG. 19, the source electrode SE and the drain electrode DE respectively filling the source contact hole CHS and the drain contact hole CHD and respectively connected to the source region SR and the drain region DR of the active layer ACT may be formed on the insulation interlayer 150. The source electrode SE may fill the source contact hole CHS and the first recess RP1, and may contact the source region SR. The drain electrode DE may fill the drain contact hole CHD and the second recess RP2, and may contact the drain region DR.

The display device according to the inventive concepts may be applied to a display device included in a computer, a notebook, a mobile phone, a smartphone, a smart pad, a PMP, a PDA, an MP3 player, or the like.

Although the methods of manufacturing the display devices according to the inventive concepts have been described with reference to the drawings, the illustrated embodiments are examples, and may be modified and changed by a person having ordinary knowledge in the relevant technical field without departing from the technical spirit of the inventive concepts described in the following claims.

What is claimed is:

1. A method of manufacturing a display device, the method comprising:
   forming a polysilicon layer on a substrate;
   patterning the polysilicon layer to form a polysilicon pattern including a first region and a second region each having a first thickness, and a third region having a second thickness less than the first thickness;
   forming a gate insulation layer on the polysilicon pattern;
   forming a gate electrode on the gate insulation layer;
   implanting ions into part of the polysilicon pattern to form an active layer, after forming the gate electrode;
   forming an insulation interlayer on the gate electrode;
   forming a source contact hole and a drain contact hole, each of the source contact hole and the drain contact hole passing through the insulation interlayer and the gate insulation layer and respectively overlapping the first region and the second region;
   forming a source electrode and a drain electrode respectively filling the source contact hole and the drain contact hole; and
   forming a light emitting element electrically connected to the source electrode or the drain electrode,
   wherein forming the source contact hole and the drain contact hole includes flattening an upper surface of the active layer.

2. The method of claim 1, wherein forming the polysilicon layer includes:
   forming an amorphous silicon layer on the substrate;
   cleaning the amorphous silicon layer with hydrofluoric acid;
   rinsing the amorphous silicon layer with hydrogenated deionized water; and
   irradiating the amorphous silicon layer with a laser beam.

3. The method of claim 2, wherein an energy density of the laser beam is in a range of 450 mJ/cm$^2$ to 500 mJ/cm$^2$.

4. The method of claim 1, wherein the first thickness is greater than 250 angstroms (Å) and less than 470 Å.

5. The method of claim 1, wherein the second thickness is in a range of 250 Å to 450 Å.

6. The method of claim 1, wherein patterning the polysilicon layer includes:
   forming a photoresist layer on the polysilicon layer;
   patterning the photoresist layer to form a first photoresist pattern overlapping the first region, the second region, and the third region;
   etching the polysilicon layer by the first thickness using the first photoresist pattern;
   patterning the first photoresist pattern to form a second photoresist pattern overlapping the first region and the second region; and
   etching the polysilicon layer by a thickness obtained by subtracting the second thickness from the first thickness using the second photoresist pattern.

7. The method of claim 6, wherein:
   the first photoresist pattern is formed by exposing and developing the photoresist layer with a first mask; and
   the second photoresist pattern is formed by exposing and developing the first photoresist pattern with a second mask.

8. The method of claim 6, wherein:
   the first photoresist pattern is formed by exposing and developing the photoresist layer with a halftone mask; and
   the second photoresist pattern is formed by ashing the first photoresist pattern.

9. The method of claim 1, wherein the active layer includes:
   a source region including the first region and implanted with the ions;
   a drain region including the second region and implanted with the ions; and
   a channel region formed between the source region and the drain region and not implanted with the ions.

10. The method of claim 9, wherein the channel region overlaps the gate electrode.

11. The method of claim 1, wherein forming the source contact hole and the drain contact hole includes:
    etching the first region and the second region of the polysilicon pattern by a thickness greater than or equal to a thickness obtained by subtracting the second thickness from the first thickness.

12. The method of claim 1, wherein forming the light emitting element includes:
    forming a first electrode electrically connected to the source electrode or the drain electrode;
    forming an emission layer on the first electrode; and
    forming a second electrode on the emission layer.

13. A method of manufacturing a display device, the method comprising:
    forming a polysilicon layer on a substrate;
    patterning the polysilicon layer to form a polysilicon pattern including a main body, and a first protrusion and a second protrusion each protruding upward from an upper surface of the main body;
    forming a gate insulation layer on the polysilicon pattern;
    forming a gate electrode on the gate insulation layer;
    implanting ions into part of the polysilicon pattern to form an active layer, after forming the gate electrode;
    forming an insulation interlayer on the gate electrode;
    forming a source contact hole and a drain contact hole, each of the source contact hole and the drain contact hole passing through the insulation interlayer and the gate insulation layer and respectively overlapping the first protrusion and the second protrusion;
    forming a source electrode and a drain electrode respectively filling the source contact hole and the drain contact hole; and
    forming a light emitting element electrically connected to the source electrode or the drain electrode,
    wherein forming the source contact hole and the drain contact hole includes completely removing each of the first protrusion and the second protrusion of the polysilicon pattern.

14. The method of claim 13, wherein forming the polysilicon layer includes:
    forming an amorphous silicon layer on the substrate;
    cleaning the amorphous silicon layer with hydrofluoric acid;
    rinsing the amorphous silicon layer with hydrogenated deionized water; and
    irradiating the amorphous silicon layer with a laser beam.

15. The method of claim 13, wherein a thickness of the main body is in a range of 250 Å to 450 Å.

16. The method of claim 13, wherein each of a thickness of the first protrusion and a thickness of the second protrusion is greater than 0 Å and less than 220 Å.

17. The method of claim 13, wherein the active layer includes:
   a source region including the first protrusion and implanted with the ions;
   a drain region including the second protrusion and implanted with the ions; and
   a channel region formed between the source region and the drain region and not implanted with the ions.

18. The method of claim 17, wherein the channel region overlaps the gate electrode.

19. The method of claim 13, wherein forming the source contact hole and the drain contact hole further includes:
   forming a first recess overlapping the source contact hole and a second recess overlapping the drain contact hole in the active layer.

* * * * *